United States Patent
Baader et al.

(10) Patent No.: US 11,130,672 B2
(45) Date of Patent: Sep. 28, 2021

(54) MICROMECHANICAL DEVICE AND CORRESPONDING PRODUCTION METHOD

(71) Applicant: Robert Bosch GmbH, Stuttgart (DE)

(72) Inventors: Johannes Baader, Haslach (DE); Nicolas Schorr, Reutlingen (DE); Rainer Straub, Ammerbuch (DE); Stefan Pinter, Reutlingen (DE); Tina Steigert, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/636,939

(22) PCT Filed: Jul. 30, 2018

(86) PCT No.: PCT/EP2018/070579
§ 371 (c)(1),
(2) Date: Feb. 6, 2020

(87) PCT Pub. No.: WO2019/030040
PCT Pub. Date: Feb. 14, 2019

(65) Prior Publication Data
US 2020/0361765 A1 Nov. 19, 2020

(30) Foreign Application Priority Data
Aug. 7, 2017 (DE) .......................... 102017213631.6

(51) Int. Cl.
*B81B 7/02* (2006.01)
*B81C 1/00* (2006.01)

(52) U.S. Cl.
CPC ............ *B81B 7/02* (2013.01); *B81C 1/00246* (2013.01); *B81B 2203/033* (2013.01);
(Continued)

(58) Field of Classification Search
CPC ................ B81B 7/02; B81B 2203/033; B81B 2203/0338; B81B 7/0058; B81C 1/00246;
(Continued)

(56) References Cited

U.S. PATENT DOCUMENTS 6,406,636 B1 6/2002 Vaganov
6,956,283 B1 10/2005 Peterson
(Continued)

FOREIGN PATENT DOCUMENTS

DE 10342155 A1 4/2005
DE 102005040789 A1 3/2007
(Continued)

OTHER PUBLICATIONS

International Search Report for PCT/EP2018/070579, dated Nov. 15, 2018.

*Primary Examiner* — Yasser A Abdelaziez
(74) *Attorney, Agent, or Firm* — Norton Rose Fulbright US LLP; Gerard Messina

(57) ABSTRACT

A micromechanical apparatus and a corresponding production method are described. The micromechanical apparatus encompasses a base substrate having a front side and a rear side; and a cap substrate, at least one surrounding trench having non-flat side walls being embodied in the front side of the base substrate; the front side of the base substrate and the trench being coated with at least one metal layer; the non-flat side walls of the trench being covered nonconformingly with the metal so that they do not form an electrical current path in a direction extending perpendicularly to the front side; and a closure, in particular a seal-glass closure, being embodied in the region of the trench between the base substrate and the cap substrate.

8 Claims, 2 Drawing Sheets

(52) U.S. Cl.
CPC  *B81C 2201/013* (2013.01); *B81C 2203/0109* (2013.01); *B81C 2203/019* (2013.01); *B81C 2203/0118* (2013.01)

(58) Field of Classification Search
CPC ...... B81C 2201/013; B81C 2203/0109; B81C 2203/0118; B81C 2203/019; B81C 2201/0112
See application file for complete search history.

(56) References Cited

U.S. PATENT DOCUMENTS

| | | |
|---|---|---|
| 2004/0097077 A1 | 5/2004 | Nallan et al. |
| 2009/0085173 A1* | 4/2009 | Boemmels ........ H01L 21/76843 257/635 |
| 2010/0133697 A1* | 6/2010 | Nilsson ................ H05K 3/4076 257/774 |
| 2011/0008959 A1 | 1/2011 | Morgan |
| 2011/0298140 A1* | 12/2011 | Reinmuth ........... B81C 1/00301 257/774 |
| 2012/0015517 A1* | 1/2012 | Oshida .............. H01L 23/53238 438/667 |
| 2012/0327092 A1 | 12/2012 | Sasagawa |
| 2016/0229685 A1 | 8/2016 | Boysel |

FOREIGN PATENT DOCUMENTS

| | | |
|---|---|---|
| DE | 102008042347 A1 | 4/2010 |
| DE | 102010029760 A1 | 12/2011 |
| EP | 2897162 A1 | 7/2015 |

* cited by examiner

MICROMECHANICAL DEVICE AND CORRESPONDING PRODUCTION METHOD

FIELD

The present invention relates to a micromechanical apparatus and to a corresponding production method.

BACKGROUND INFORMATION

Although any micromechanical components are also usable, the present invention and the problem on which it is based will be explained with reference to components having microchips.

Microchips are subject to stringent requirements regarding sealing. For instance, they must pass so-called moisture tests with no occurrence of corrosion, for example due to a redox reaction, for instance intermetallic corrosion of an aluminum/silver metal stack exposed at the sawn face of the chip. The metal stack is continuous, i.e., deposited over the entire surface of the chip, and is thus also the substrate of a seal-glass bond that is described, for example, in German Patent Application No. DE 10 2005 040 789 A1. If this metal stack corrodes in response to moisture, the seal-glass bond becomes detached from the adhesion layer and sufficient sealing can possibly be impaired. One countermeasure in accordance with the existing art would be local removal of metal in the external region of the chip, as described, e.g., in German Patent Application No. DE 103 42 155 A1.

SUMMARY

The present invention relates to a micromechanical apparatus as and a corresponding production method.

An example micromechanical apparatus encompasses a cap substrate, at least one surrounding trench having non-flat side walls being embodied in the front side of the base substrate; the front side of the base substrate and the trench being coated with at least one metal layer; the non-flat side walls of the trench being covered nonconformingly with the metal so that they do not form an electrical current path in a direction extending perpendicularly to the front side; and a closure means, in particular a seal-glass closure, being embodied in the region of the trench between the base substrate and the cap substrate.

Preferred refinements of the present invention are described herein.

Example embodiments of the present invention may provide the capability for producing a micromechanical apparatus with reduced sensitivity, in which the metallic corrosion path (current path) between the environment and the encapsulated interior is interrupted by way of a trench structure, so that the environment and the encapsulated interior are galvanically disconnected with no need for the metal layer to be separately patterned. The metal layer thus remains intact in the interior, and is interrupted on the non-flat side walls of the trench. Robustness with respect to moisture and various environmental influences on the micromechanical apparatus can thereby be particularly advantageously enhanced.

According to a preferred refinement of the example micromechanical apparatus according to the present invention, the metal layer encompasses at least one metal from the group consisting of aluminum, silver, and gold. Many of the functional tasks of micromechanical apparatuses can be performed particularly advantageously with these metals.

According to a preferred refinement of the micromechanical apparatus according to the present invention, the front side of the base substrate and the trench are coated with two different metal layers. This results in a plurality of additional applications, and at the same time avoids intermetallic corrosion, which can occur in applications in which metals having very different electrochemical potentials, such as silver/aluminum, are used.

According to a preferred refinement of the micromechanical apparatus according to the present invention, the base substrate and the trench are coated with a metal layer made of silver, on which a metal layer made of aluminum is applied. Many of the tasks of micromechanical apparatuses having a microchip can thereby be performed particularly advantageously, while intermetallic corrosion can be avoided.

According to a preferred refinement of the micromechanical apparatus according to the present invention, the trench has a width from 10 micrometers to 100 micrometers and a depth from 20 micrometers to 200 micrometers. The current path between the two sides of the trench can be interrupted effectively by selecting these dimensions.

According to a preferred refinement of the micromechanical apparatus according to the present invention, the non-flat side walls of the trench exhibit a plurality of recesses preferably having a depth from 1 micrometer to 10 micrometers. The current path between the two sides of the trench can thereby be interrupted particularly reliably.

According to a preferred refinement of the micromechanical apparatus according to the present invention, the seal-glass closure completely covers the trench.

BRIEF DESCRIPTION OF THE DRAWINGS

The present invention is explained in further detail below with reference to the exemplifying embodiments shown in the figures.

DETAILED DESCRIPTION OF EXAMPLE EMBODIMENTS

Figure 1:
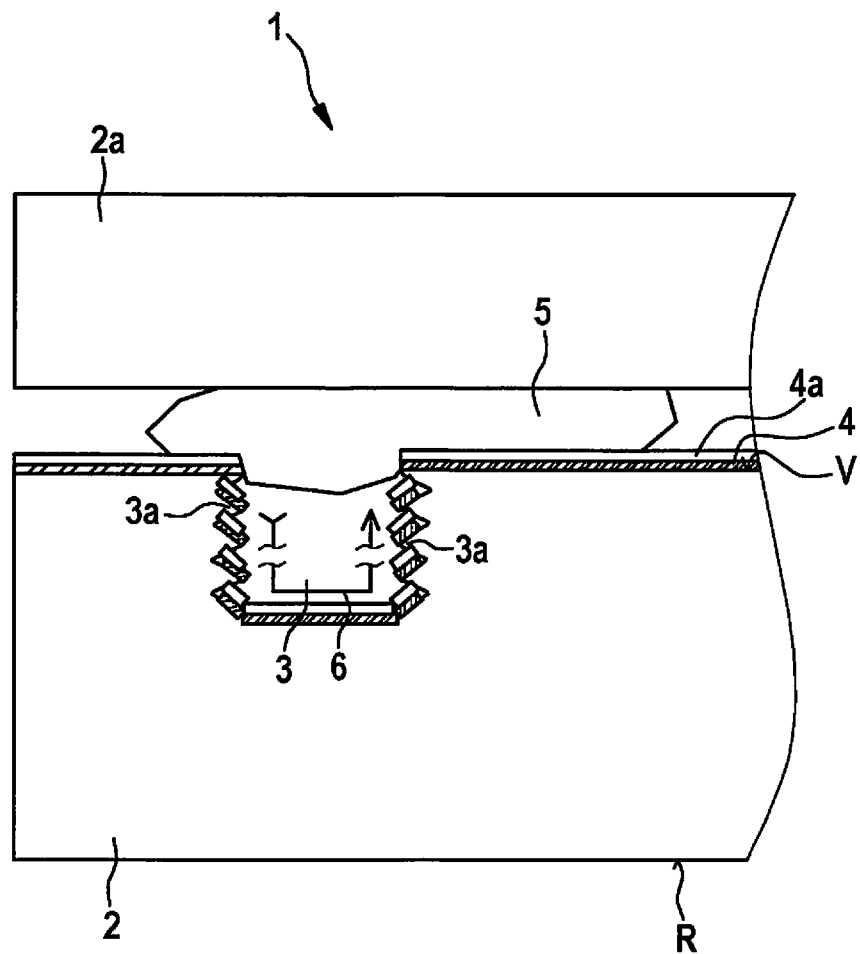
FIG. 1 is a schematic depiction, in cross section, to explain a micromechanical apparatus in accordance with a first embodiment of the present invention.

In the Figures, identical reference characters refer to identical or functionally identical elements.

FIG. 1 is a schematic depiction, in cross section, to explain a micromechanical apparatus in accordance with a first embodiment of the present invention.

In FIG. 1, the reference character 1 identifies the micromechanical apparatus, which has a base substrate 2 having a front side V and a rear side R. The reference character 2a identifies a cap substrate, 3 a surrounding trench, 3a non-flat side walls of trench 3, 4 a first metal layer and 4a a second metal layer, 5 a seal-glass closure, and 6 an interrupted current path along the non-flat side walls 3a as a result of a nonconforming embodiment of metal layers 4, 4a.

One conventional method for galvanically disconnecting a metal layer and/or several metal layers is selective removal of the metal in certain regions, i.e., patterning of the metal, for instance by lithography and subsequent etching.

The example embodiment of the present invention includes avoidance of a lithography and etching step of this kind, by the fact that even before first metal layer 4 and additional metal layer 4a are applied onto front side V of base substrate 2, surrounding trench 3 is embodied with non-flat side walls 3a, the non-flat side walls 3a being nonconformingly covered during subsequent deposition of first metal layer 4 and additional metal layer 4a. For instance, a trench 3 that is 35 micrometers wide and 90 micrometers deep is etched surroundingly in the region of front side V of base substrate into the silicon, by "trenching" or DRIE.

Side walls 3a of this trench 3 exhibit the recesses that are typical of this trenching process. First metal 4 and second metal 4a that are applied via a sputtering process into these local recesses are deposited nonconformingly, i.e., only onto the underside of the recesses. Current path 6 between the environment and the encapsulated interior is thereby interrupted, and a redox reaction that might cause intermetallic corrosion therefore cannot proceed in the interior.

The advantages of this pre-patterning of base substrate 2 are the elimination of the working steps necessary for production of a resist mask (such as application, exposure, development, in-process monitoring, heating), and elimination of the need for metal etching, which reduces process costs; as well as elimination of the working steps required for removal of the resist mask, e.g., combustion in oxygen plasma, special wet cleaning, in-process monitoring, or baking out. The result of omitting the aforementioned process steps is reduced stress on the metal layer. It is thereby possible to avoid contaminants, increased surface roughness, local surface etching, contamination, changes in optical properties, temperature stress, scratches, and changes in chemical properties resulting, for instance, from attack by oxygen radicals during combustion of the resist mask. Lithography is furthermore not possible in some process states of base substrate 2, and this need for metal patterning is thus completely eliminated.

A trench 3 produced by deep reactive ion etching (DRIE), or a trenching process, has on its side walls 3a the local micro-scale recesses that do not become occupied upon deposition of dissimilar metals 4 and 4a by cathodic atomization or sputtering. As a result, the current path between the two sides of trench 3 is interrupted or exhibits high resistance. Corresponding resistance measurements show an electrical resistance of approximately 600 kilohms for the trench structure, as opposed to 2 ohms without trench 3.

Figure 2:
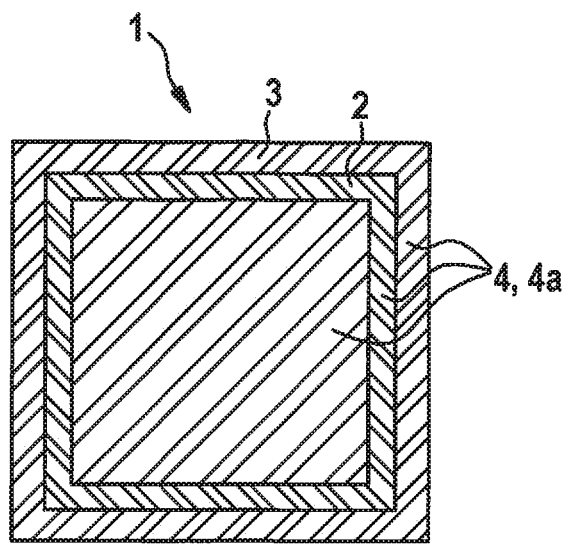
FIG. 2 is a schematic depiction, in a plan view, to explain a micromechanical apparatus in accordance with the first embodiment of the present invention, shown without a cap substrate.

FIG. 2 is a schematic depiction, in a plan view, to explain a micromechanical apparatus in accordance with the first embodiment of the present invention, shown without a cap substrate.

The above-described functionality of trench 3 is utilized by the present invention to disconnect the current path between the external environment exposed to environmental influences, and the interior packaged in hermetically sealed fashion. For instance, contact between base substrate 2 and an electrolyte-containing medium, for example an NaCl solution, can cause intermetallic corrosion if a first metal was deposited as first metal layer 4 and a second metal as second metal layer 4a, as in the case of a silver/aluminum stack. Intermetallic corrosion thus can no longer take place in the interior, since the electron transfer necessary for it is interrupted. In terms of electrochemistry, corrosion principally involves redox reactions of metals under the influence of water, salt solutions, and acids, and between dissimilar metals.

Seal-glass closure 5, which becomes drawn into trench 3 by cohesive forces during the joining process and produces a moisture-tight closure, is used, for instance, to produce hermetic sealing of the interior with respect to the environment.

Figure 3:
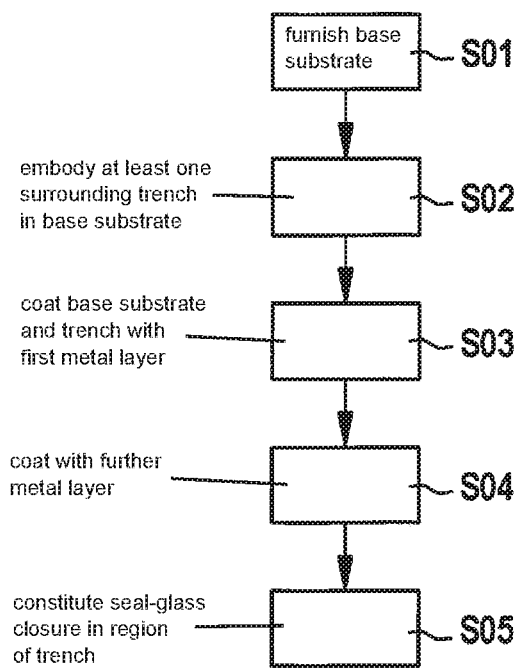
FIG. 3 is a schematic flow chart to explain a method for producing a micromechanical apparatus in accordance with a second embodiment.

FIG. 3 is a schematic flow chart to explain a method for producing a micromechanical apparatus, having a microchip with decreased sensitivity to metal corrosion, in accordance with a second embodiment.

In a step S01, a base substrate 2 is furnished. In a step S02, at least one surrounding trench 3 having non-flat side walls 3a is embodied in this base substrate 2, and in a step S03, base substrate 2 and trench 3 are coated with a first metal layer 4 made, for example, of silver. In a step S04, further coating can occur with at least one further metal layer 4a that has a metal (e.g. aluminum) that is dissimilar to the metal of first metal 4; and in a step S05, seal-glass closure 5 is constituted in conventional fashion in the region of trench 3.

Although the present invention has been described with reference to preferred exemplifying embodiments, it is not limited thereto. In particular, the materials and topologies that are recited are merely examples and are not limited to the examples explained.

Particularly preferred further applications for the micromechanical apparatus according to the present invention are, for example, in applications involving increased environmental influences or chemically reactive atmospheres.

What is claimed is:

1. A micromechanical apparatus, comprising:
a base substrate having a front side and a rear side, the base substrate includes at least one trench having non-flat side walls embodied in the front side of the base substrate, the front side of the base substrate and the trench are coated with at least one metal layer, and the non-flat side walls of the trench are covered nonconformingly with metal of the metal layer so that the non-flat side walls of the trench do not form an electrical current path in a direction extending perpendicularly to the front side; and
a cap substrate; and
a seal-glass closure embodied in a region of the trench between the base substrate and the cap substrates;
wherein the front side of the base substrate and the trench are coated with two different metal layers.

2. The micromechanical apparatus as recited in claim 1, the metal layer encompasses at least one metal from the group consisting of aluminum, silver, and gold.

3. The micromechanical apparatus as recited in claim 1, wherein the front side of the base substrate and the trench are coated with a metal layer made of silver, on which a metal layer made of aluminum is applied.

4. The micromechanical apparatus as recited in claim 1, wherein the trench has a width from 10 micrometers to 100 micrometers and a depth from 20 micrometers to 200 micrometers.

5. The micromechanical apparatus as recited in claim 1, wherein the non-flat side walls of the trench have a plurality of recesses.

6. The micromechanical apparatus as recited in claim 5, wherein each of the recesses has a depth from 1 micrometer to 10 micrometers.

7. The micromechanical apparatus as recited in claim 1, wherein the seal-glass closure completely covers the trench.

8. A method for producing a micromechanical apparatus, comprising the following steps:
- furnishing a base substrate having a front side and a rear side, the base substrate including at least one trench having non-flat side walls embodied in the front side of the base substrate, the front side of the base substrate and the trench being coated with at least one metal layer, the non-flat side walls of the trench being covered nonconformingly with metal of the metal layer so that the non-flat side walls do not form an electrical current path in a direction extending perpendicularly to the front side;
- furnishing a cap substrate; and
- providing a seal-glass closure in a region of the trench between the base substrate and the cap substrate;
- wherein the front side of the base substrate and the trench are coated with two different metal layers.

\* \* \* \* \*